US006030750A

United States Patent [19]

Vermeersch et al.

[11] Patent Number: 6,030,750

[45] **Date of Patent: *Feb. 29, 2000**

[54] METHOD FOR MAKING A LITHOGRAPHIC PRINTING PLATE INVOLVING ON PRESS DEVELOPMENT

[75] Inventors: Joan Vermeersch, Deinze; Marc Van Damme, Heverlee, both of Belgium

[73] Assignee: Agfa-Gevaert. N.V., Mortsel, Belgium

[ * ] Notice: This patent issued on a continued prosecution application filed under 37 CFR 1.53(d), and is subject to the twenty year patent term provisions of 35 U.S.C. 154(a)(2).
This patent is subject to a terminal disclaimer.

[21] Appl. No.: 08/715,496

[22] Filed: Sep. 18, 1996

Related U.S. Application Data

[60] Provisional application No. 60/008,562, Dec. 13, 1995.

[30] Foreign Application Priority Data

Oct. 24, 1995 [EP] European Pat. Off. .............. 95202874

[51] Int. Cl.[7] .............................................. G03F 7/00

[52] U.S. Cl. ...................... 430/302; 430/309; 101/463.1; 101/467; 101/453; 101/454; 101/457

[58] Field of Search .................................. 430/302, 309; 101/463.1, 467, 453, 454, 457

[56] References Cited

U.S. PATENT DOCUMENTS

| | | | |
|---|---|---|---|
| 3,793,033 | 2/1974 | Mukherjee | 430/302 |
| 4,004,924 | 1/1977 | Vrancken et al. | 430/302 |
| 4,225,661 | 9/1980 | Muzyczko | 430/302 |
| 5,536,619 | 7/1996 | Verburgh | 430/303 |
| 5,677,106 | 10/1997 | Burberry et al. | 430/253 |

FOREIGN PATENT DOCUMENTS

| | | |
|---|---|---|
| 1139894 | 1/1969 | United Kingdom . |

*Primary Examiner*—Maria Nuzzolillo
*Assistant Examiner*—Laur Weiner
*Attorney, Agent, or Firm*—Breiner & Breiner

[57] ABSTRACT

The present invention provides a method for making a lithographic printing plate comprising the steps of:

(1) image-wise exposing to light an imaging element comprising (i) on a hydrophilic surface of a lithographic base an image forming layer comprising hydrophobic thermoplastic polymer particles capable of coalescing under the influence of heat and dispersed in a hydrophilic binder and (ii) a compound capable of converting light to heat, said compound being comprised in said image forming layer or a layer adjacent thereto;

(2) and developing a thus obtained image-wise exposed imaging element by mounting it on a print cylinder of a printing press and supplying an aqueous dampening liquid and/or ink to said image forming layer while rotating said print cylinder.

8 Claims, 3 Drawing Sheets

METHOD FOR MAKING A LITHOGRAPHIC PRINTING PLATE INVOLVING ON PRESS DEVELOPMENT

The inventer claims priority to Ser. No. 60/008,562 filed Dec. 13, 1995.

DESCRIPTION

1. Field of the Invention.

The present invention relates to a method for making a lithographic printing plate. More in particular, the present invention relates to a method wherein the lithographic printing plate is developed on the printing press subsequent to image-wise exposure.

2. Background of the Invention

Lithography is the process of printing from specially prepared surfaces, some areas of which are capable of accepting lithographic ink, whereas other areas, when moistened with water, will not accept the ink. The areas which accept ink form the printing image areas and the ink-rejecting areas form the background areas.

In the art of photolithography, a photographic material is made imagewise receptive to oily or greasy inks in the photo-exposed (negative-working) or in the non-exposed areas (positive-working) on a hydrophilic background.

In the production of common lithographic printing plates, also called surface litho plates or planographic printing plates, a support that has affinity to water or obtains such affinity by chemical treatment is coated with a thin layer of a photosensitive composition. Coatings for that purpose include light-sensitive polymer layers containing diazo compounds, dichromate-sensitized hydrophilic colloids and a large variety of synthetic photopolymers. Particularly diazo-sensitized systems are widely used.

Upon image-wise exposure of the light-sensitive layer the exposed image areas become insoluble and the unexposed areas remain soluble. The plate is then developed with a suitable liquid to remove the diazonium salt or diazo resin in the unexposed areas.

Commercially available diazo based printing plates most commonly use an anodized and roughened aluminium as a support having a hydrophilic surface. However, commercial plates are also available that use a flexible support such as paper provided with a hydrophilic layer. For example, Lithocraft 10008 FOTOPLATE™ is a diazo based printing plate that comprises on a paper support a hydrophilic layer on top of which is provided a diazo based photosensitive layer. According to plate instructions of the supplier, a plate can be prepared by image-wise exposure of the lithographic printing plate precursor or imaging element, mounting the exposed imaging element on the press and wiping its surface with Lithocraft™ 10008 Developer Desensitizer. The plate instructions also contemplate a method wherein no developer desensitizer is used. However, such method most often results in poor lithographic preformance so that in practice a Developer Desensitizer is almost always needed.

A particular disadvantage of photosensitive imaging elements such as described above for making a printing plate is that they have to be shielded from the light. This is a particular disadvantage if on press development is contemplated since mounting the image-wise exposed imaging element is generally done in normal daylight so that the handling time for mounting the imaging element is limited. Moreover, diazo based aluminium type printing plates are completely unsuitable for on press development.

On the other hand, methods are known for making printing plates involving the use of imaging elements that are heat sensitive rather than photosensitive. For example, Research Disclosure no. 33303 of Jan. 1992 discloses a heat sensitive imaging element comprising on a support a cross-linked hydrophilic layer containing thermoplastic polymer particles and an infrared absorbing pigment such as e.g. carbon black. By image-wise exposure to an Infrared laser, the thermoplastic polymer particles are image-wise coagulated thereby rendering the surface of the imaging element and these areas ink acceptant without any further development. A disadvantage of this method is that the printing plate obtained is easily damaged since the non-printing areas may become ink accepting when some pressure is applied thereto. Moreover, under critical conditions, the lithographic performance of such a printing plate may be poor and accordingly such printing plate has little lithographic printing latitude.

3. SUMMARY OF THE INVENTION

It is an object of the present invention to provide a method for making a printing plate having excellent printing properties in a convenient an environmental friendly way.

Further objects of the present invention will become clear from the description hereinafter.

According to the present invention there is provided a method for making a lithographic printing plate comprising the steps of:

(1) image-wise exposing to light an imaging element comprising (i) on a hydrophilic surface of a lithographic base an image forming layer comprising hydrophobic thermoplastic polymer particles capable of coalescing under the influence of heat and dispersed in a hydrophilic binder and (ii) a compound capable of converting light to heat, said compound being comprised in said image forming layer or a layer adjacent thereto;

(2) and developing a thus obtained image-wise exposed imaging element by mounting it on a print cylinder of a printing press and supplying an aqueous dampening liquid and/or ink to said image forming layer while rotating said print cylinder.

The present invention further provides a method for making multiple copies of an orginal image comprising the steps of:

(1) image-wise exposing to light an imaging element comprising (i) on a hydrophilic surface of a lithographic base an image forming layer comprising hydrophobic thermoplastic polymer particles capable of coalescing under the influence of heat and dispersed in a hydrophilic binder and (ii) a compound capable of converting light to heat, said compound being comprised in said image forming layer or a layer adjacent thereto;

(2) mounting a thus obtained image-wise exposed imaging element without development, on a print cylinder of a printing press;

(3) rotating said print cylinder while supplying an aqueous dampening liquid and/or supplying ink to said image forming layer of said imaging element and (4) transfering ink from said imaging element to a receiving element which is generally a paper sheet.

The present invention further relates to a method for making a lithographic printing plate comprising the steps of:

(1) mounting an imaging element comprising (i) on a hydrophilic surface of a lithographic base an image forming layer comprising hydrophobic thermoplastic polymer particles capable of coalescing under the influence of heat and dispersed in a hydrophilic binder and (ii) a compound capable of converting light to heat, said compound being comprised in said image forming layer or a layer adjacent thereto on a print cylinder of a printing press;

(2) image-wise exposing said imaging element by means of a laser or LED;

(3) and developing a thus obtained image-wise exposed imaging element by supplying an aqueous dampening liquid and/or ink to said image forming layer while rotating said print cylinder.

The present invention also discloses a method for making multiple copies from an original comprising the steps of:

(1) mounting an imaging element comprising (i) on a hydrophilic surface of a lithographic base an image forming layer comprising hydrophobic thermoplastic polymer particles capable of coalescing under the influence of heat and dispersed in a hydrophilic binder and (ii) a compound capable of converting light to heat, said compound being comprised in said image forming layer or a layer adjacent thereto on a print cylinder of a printing press;

(2) image-wise exposing said imaging element by means of a laser or LED;

(3) developing a thus obtained image-wise exposed imaging element by supplying an aqueous dampening liquid and/or ink to said image forming layer while rotating said print cylinder;

(4) transfering ink from said imaging element to a receiving element.

The present invention also describes a printing apparatus comprising:

(i) at least one print station including:
   a print cylinder;
   means for mounting to the print cylinder an imaging element;
   at least one laser or L.E.D device;
   means for guiding output of said laser or L.E.D. device to focus on the imaging elements surface;
   means for moving the guiding means and support means relative to one another to effect a scan of the imaging elements surface by the output of said laser or L.E.D. device;

(ii) means for supplying a dampening liquid to said print cylinder;

(iii) means for supplying ink to said print cylinder;

(iv) means for transferring a receiving element to said print station;

(v) means for transferring ink from said print cylinder to said receiving element.

In a still further aspect, the present invention relates to a method for making a lithographic printing plate comprising the steps of:

(1) image-wise exposing to light an imaging element comprising (i) on a hydrophilic surface of a lithographic base an image forming layer comprising hydrophobic thermoplastic polymer particles capable of coalescing under the influence of heat and dispersed in a hydrophilic binder and (ii) a compound capable of converting light to heat, said compound being comprised in said image forming layer or a layer adjacent;

(2) and developing a thus obtained image-wise exposed imaging element by rinsing it with plain water.

4. BRIEF DESCRIPTION OF THE DRAWINGS

The present invention is illustrated by way of reference to the following drawings without however the intention to limit the invention thereto:

5. DETAILED DESCRIPTION OF THE INVENTION

Figure 1:
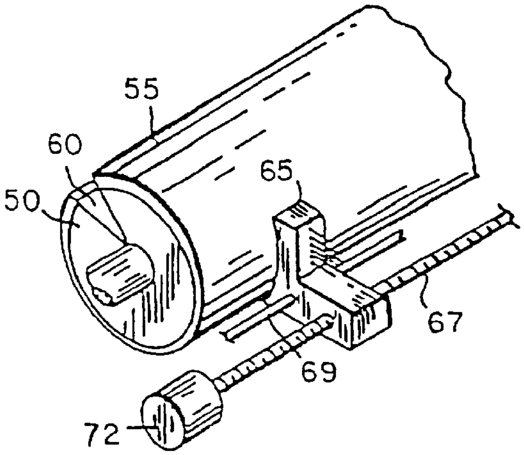
FIG. 1 is an isometric view of the cylindrical embodiment of an imaging apparatus suitable for use in accordance with the present invention, and which operates in conjunction with a diagonal-array writing array.

An imaging element for use in accordance with the present invention comprises on a hydrophilic surface of a lithographic base an image forming layer comprising hydrophobic thermoplastic polymer particles capable of coalescing under the influence of heat and dispersed in a hydrophilic binder. The hydrophilic binder used in connection with the present invention is perferably not cross-linked or only sightly cross-linked. The imaging element further includes a compound capable of converting light to heat. This compound is preferably comprised in the image forming layer but can also be provided in a layer adjacent to the image forming layer.

Preferably the imaging element for use in accordance with the present invention consist of a lithographic base and on the hydrophilic surface of said lithographic base an image forming layer comprising hydrophobic thermoplastic polymer particles capable of coalescing under the influence of heat and dispersed in a hydrophilic binder.

According to one embodiment of the present invention, the lithographic base can be an anodised aluminium. A particularly preferred lithographic base is an electrochemically grained and anodised aluminium support. According to the present invention, an anodised aluminium support may be treated to improve the hydrophilic properties of its surface. For example, the aluminium support may be silicated by treating its surface with sodium silicate solution at elevated temperature, e.g. 9° C. Alternatively, a phosphate treatment may be applied which involves treating the aluminium oxide surface with a phosphate solution that may further contain an inorganic fluoride. Further, the aluminium oxide surface may be rinsed with a citric acid or citrate solution. This treatment may be carried out at room temperature or can be carried out at a slightly elevated temperature of about 30 to 50° C. A further interesting treatment involves rinsing the aluminium oxide surface with a bicarbonate solution. It is further evident that one or more of these post treatments may be carried out alone or in combination.

According to another embodiment in connection with the present invention, the lithographic base comprises a flexible support, such as e.g. paper or plastic film, provided with a cross-linked hydrophilic layer. A particularly suitable cross-linked hydrophilic layer may be obtained from a hydrophilic binder cross-linked with a cross-linking agent such as formaldehyde, glyoxal, polyisocyanate or a hydrolysed tetra-alkylorthosilicate. The latter is particularly preferred.

As hydrophilic binder there may be used hydrophilic (co)polymers such as for example, homopolymers and copolymers of vinyl alcohol, acrylamide, methylol acrylamide, methylol methacrylamide, acrylic acid, methacrylic acid, hydroxyethyl acrylate, hydroxyethyl methacrylate or maleic anhydride/vinylmethylether copolymers. The hydrophilicity of the (co)polymer or (co)polymer mixture used is preferably the same as or higher than the hydrophilicity of polyvinyl acetate hydrolyzed to at least an extent of 60 percent by weight, preferably 80 percent by weight.

The amount of crosslinking agent, in particular of tetraalkyl orthosilicate, is preferably at least 0.2 parts by weight per part by weight of hydrophilic binder, preferably between 0.5 and 5 parts by weight, more preferably between 1.0 parts by weight and 3 parts by weight.

A cross-linked hydrophilic layer in a lithographic base used in accordance with the present embodiment preferably also contains substances that increase the mechanical strength and the porosity of the layer. For this purpose colloidal silica may be used. The colloidal silica employed may be in the form of any commercially available water-dispersion of colloidal silica for example having an average particle size up to 40 nm, e.g. 20 nm. In addition inert particles of larger size than the colloidal silica can be added e.g. silica prepared according to Stbber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the cross-linked hydrophilic layer is given a uniform rough texture consisting of microscopic hills and valleys, which serve as storage places for water in background areas.

The thickness of a cross-linked hydrophilic layer in a lithographic base in accordance with this embodiment may vary in the range of 0.2 to 25 μm and is preferably 1 to 10 μm.

Particular examples of suitable cross-linked hydrophilic layers for use in accordance with the present invention are disclosed in EP-A 601240, GB-P-1419512, FR-P-2300354, U.S. Pat. No. 3,971,660, U.S. Pat. No. 4,284,705 and EP-A 514490.

As flexible support of a lithographic base in connection with the present embodiment it is particularly preferred to use a plastic film e.g. substrated polyethylene terephthalate film, cellulose acetate film, polystyrene film, polycarbonate film etc. . . . The plastic film support may be opaque or transparent.

It is particularly preferred to use a polyester film support to which an adhesion improving layer has been provided. Particularly suitable adhesion improving layers for use in accordance with the present invention comprise a hydrophilic binder and colloidal silica as disclosed in EP-A 619524, EP-A 620502 and EP-A 619525. Preferably, the amount of silica in the adhesion improving layer is 200 mg per $m^2$ and 750 mg per $m^2$. Further, the ratio of silica to hydrophilic binder is preferably more than 1 and the surface area of the colloidal silica is preferably at least 300 $m^2$ per gram, more preferably a surface area of 500 $m^2$ per gram.

In accordance with the present invention, on top of a hydrophilic surface there is provided an image forming layer. Optionally, there may be provided one or more intermediate layers between the lithographic base and the image forming layer. An image forming layer in connection with the present invention comprises thermoplastic polymer particles capable of coalescing under the influence of heat and dispersed in a hydrophilic binder.

Suitable hydrophilic binders for use in an image forming layer in connection with this invention are for example synthetic homo or copolymers such as a polyvinylalcohol, a poly(meth)acrylic acid, a poly(meth)acrylamide, a polyhydroxyethyl(meth)acrylate, a polyvinylmethylether or natural binders such as gelatin, a polysacharide such as e.g. dextran, pullulan, cellulose, arabic gum, alginic acid.

Hydrophobic thermoplastic polymer particles used in connection with the present invention preferably have a coagulation temperature above 35° C. and more preferably above 50° C. Coagulation may result from softening or melting of the thermoplastic polymer particles under the influence of heat. There is no specific upper limit to the coagulation temperature of the thermoplastic hydrophobic polymer particles, however the temperature should be sufficiently below the decomposition of the polymer particles. Preferably the coagulation temperature is at least 10° C. below the temperature at which the decomposition of the polymer particles occurs. When said polymer particles are subjected to a temperature above coagulation temperature they coagulate to form a hydrophobic agglomerate in the hydrophilic layer so that at these parts the hydrophilic layer becomes insoluble in plain water or an aqueous liquid.

Specific examples of hydrophobic polymer particles for use in connection with the present invention are e.g. polyethylene, polyvinyl chloride, polymethyl (meth) acrylate, polyethyl (meth)acrylate, polyvinylidene'chloride, polyacrylonitrile, polyvinyl carbazole etc. or copolymers thereof. Most preferably used is polyethylene.

The weight average molecular weight of the polymers may range from 5,000 to 1,000,000 g/mol.

The hydrophobic particles may have a particle size from 0.01 μm to 50 μm, more preferably between 0.05 mm and 10 mm and most preferably between 0.05 μm and 2 μm.

The polymer particles are present as a dispersion in the aqueous coating liquid of the image forming layer and may be prepared by the methods disclosed in U.S. Pat. No. 3,476,937. Another method especially suitable for preparing an aqueous dispersion of the thermoplastic polymer particles comprises:

dissolving the hydrophobic thermoplastic polymer in an organic water immiscible solvent, dispersing the thus obtained solution in water or in an aqueous medium and removing the organic solvent by evaporation.

The amount of hydrophobic thermoplastic polymer particles contained in the image forming layer is preferably between 20% by weight and 65% by weight and more preferably between 25% by weight and 55% by weight and most preferably between 30% by weight and 45% by weight.

Suitable compounds capable of converting light into heat are preferably infrared absorbing components although the wavelength of absorption is not of particular importance as long as the absorption of the compound used is in the wavelength range of the light source used for image-wise exposure. Particularly useful compounds are for example dyes and in particular infrared dyes, carbon black, metal carbides, borides, nitrides, carbonitrides, bronze-structured oxides and oxides structurally related to the bronze family but lacking the A component e.g. $WO_{2.9}$. It is also possible to use conductive polymer dispersion such as polypyrrole or polyaniline-based conductive polymer dispersions. The lithographic performance and in particular the print endurance obtained depends on the heat-sensitivity of the imaging element. In this respect it has been found that carbon black yields very good and favorable results.

A light to heat converting compound in connection with the present invention is most preferably added to the image forming layer but at least part of the light to heat converting compound may also be comprised in a neighbouring layer. Such layer can be for example the cross-linked hydrophilic layer of a lithographic base according to the second embodiment of lithographic bases explained above.

In accordance with a method of the present invention for obtaining a printing plate, the imaging element is image-wise exposed and subsequently is mounted on a print cylinder of a printing press. According to a preferred embodiment, the printing press is then started and while the print cylinder with the imaging element mounted thereon rotates, the dampener rollers that supply dampening liquid are dropped on the imaging element and subsequent thereto the ink rollers are dropped. Generally, after about 10 revolutions of the print cylinder the first clear and useful prints are obtained.

According to an alternative method, the ink rollers and dampener rollers may be dropped simultaneously or the ink rollers may be dropped first.

Suitable dampening liquids that can be used in connection with the present invention are aqueous liquids generally having an acidic pH and comprising an alcohol such as isopropanol. With regard to dampening liquids useful in the present invention, there is no particular limitation and commercially available dampening liquids, also known as fountain solutions, can be used.

It may be advantageous to wipe the image forming layer of an image-wise exposed imaging element with e.g. a cotton pad or sponge soaked with water before mounting the imaging element on the press or at least before the printing press starts running. This will remove some non-image areas but will not actually develop the imaging element. However, it has the advantage that possible substantial contamination of the dampening system of the press and ink used is avoided.

According to an alternative method, the imaging element is first mounted on the print cylinder of the printing press and then image-wise exposed directly on the press. Subsequent to exposure, the imaging element can be developed as described above.

The printing plate of the present invention can also be used in the printing process as a seamless sleeve printing plate. In this option the printing plate is soldered in a cylindrical form by means of a laser. This cylindrical printing plate which has as diameter the diameter of the print cylinder is slided on the print cylinder instead of applying in a classical way a classically formed printing plate. More details on sleeves are given in "Grafisch Niews", 15, 1995, page 4 to 6.

According to a still further method in connection with the present invention, the imaging element may be image-wise exposed and subsequently developed by rinsing it with plain water.

Image-wise exposure in connection with the present invention is preferably an image-wise scanning exposure involving the use of a laser or L.E.D. It is highly preferred in connection with the present invention to use a laser emitting in the infrared (IR) and/or near-infrared, i.e. emitting in the wavelength range 700–1500 nm. Particularly preferred for use in connection with the present invention are laser diodes emitting in the near-infrared.

A preferred imaging apparatus suitable for image-wise scanning exposure in accordance with the present invention preferably includes a laser output that can be provided directly to the imaging elements surface via lenses or other beam-guiding components, or transmitted to the surface of a blank imaging element from a remotely sited laser using a fiber-optic cable. A controller and associated positioning hardware maintains the beam output at a precise orientation with respect to the imaging elements surface, scans the output over the surface, and activates the laser at positions adjacent selected points or areas of the imaging element. The controller responds to incoming image signals corresponding to the original document and/or picture being copied onto the imaging element to produce a precise negative or positive image of that original. The image signals are stored as a bitmap data file on a computer. Such files may be generated by a raster image processor (RIP) or other suitable means. For example, a RIP can accept Input data in page-description language, which defines all of the features required to be transferred onto the imaging element, or as a combination of page-description language and one or more image data files. The bitmaps are constructed to define the hue of the color as well as screen frequencies and angles in case of amplitude modulation screening. However, the present invention is particularly suitable for use in combination with frequency modulation screening as disclosed in e.g. EP-A 571010, EP-A 620677 and EP-A 620674.

The imaging apparatus can operate on its own, functioning solely as a platemaker, or can be incorporated directly into a lithographic printing press having means for supplying a dampening liquid. In the latter case, printing may commence immediately after image-wise exposure and development, thereby reducing press set-up time considerably. The imaging apparatus can be configured as a flatbed recorder or as a drum recorder, with the lithographic plate blank mounted to the interior or exterior cylindrical surface of the drum. Obviously, the exterior drum design is more appropriate to use in situ, on a lithographic press, in which case the print cylinder itself constitutes the drum component of the recorder or plotter.

In a preferred drum configuration, the requisite relative motion between the laser beam and the imaging element is achieved by rotating the drum(and the imaging element mounted thereon) about its axis and moving the beam parallel to the rotation axis, thereby scanning the imaging element circumferentially so the image "grows" in the axial direction. Alternatively, the beam can move parallel to the drum axis and, after each pass across the imaging element, increment angularly so that the image on the imaging element "grows" circumferentially. In both cases, after a complete scan by the beam and development, an image corresponding to the original will have been applied to the surface of the imaging element. In the flatbed configuration, the beam is drawn across either axis of the imaging element, and is indexed along the other axis after each pass. Of course, the requisite relative motion between the beam and the imaging element may be produced by movement of the imaging element rather than (or in addition to) movement of the beam.

Regardless of the manner in which the beam is scanned, it is generally preferable (for reasons of speed) to employ a plurality of lasers and guide their outputs to a single writing array. The writing array is then indexed, after completion of each pass across or along the imaging element, a distance determined by the number of beams emanating from the array, and by the desired resolution (i.e. the number of image points per unit length.

The following describes in more detail a preferred embodiment of an imaging apparatus suitable for use in connection with the present invention.

a. Exterior-Drum Recording

Refer first to FIG. 1 of the drawings, which illustrates an exterior drum embodiment of an imaging system suitable for use in connection with the present invention. The assembly includes a cylinder 50 around which is wrapped an imaging element 55. Cylinder 50 includes a void segment 60, within which the outside margins of imaging element 55 are secured by conventional clamping means (not shown). The size of the void segment can vary greatly depending on the environment in which cylinder 50 is employed.

Desirably, cylinder 50 is straight forwardly incorporated into the design of a conventional lithographic press having means for supplying dampening liquid to the imaging element, and serves as the print cylinder of the press. In a typical press constructions imaging element 55 receives ink and dampening liquid from an ink train and a sequence of dampening cylinders respectively, whose terminal cylinders are in rolling engagement with cylinder 50. The latter cylinder also rotates in contact with a blanket cylinder, which transfers ink to the receiving element which is generally a paper sheet. The press may have more than one such printing assembly arranged in a linear array. Alternatively, a plurality of assemblies may be arranged about a large central impression cylinder in rolling engagement with all of the blanket cylinders.

Figure 2:
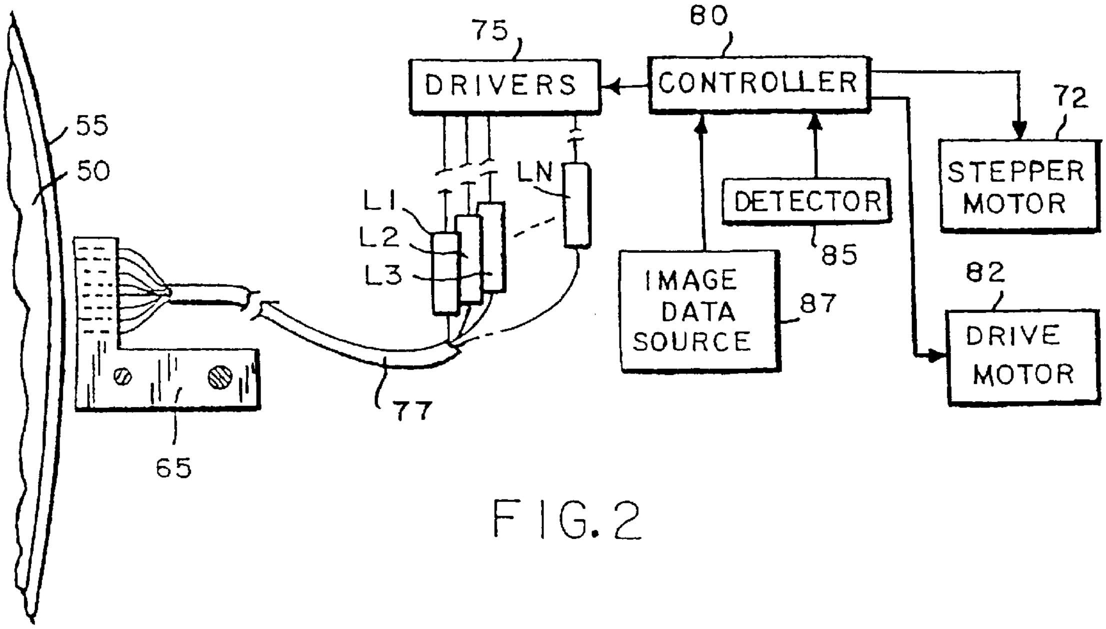
FIG. 2 is a schematic depiction of the embodiment shown in FIG. 1, and which illustrates in greater detail its mechanism of operation.

Cylinder 50 is supported in a frame and rotated by a standard electric motor or other conventional means (illustrated schematically in FIG. 2). The angular position of cylinder 50 is monitored by a shaft encoder (see FIG. 4). A writing array 65, mounted for movement on a lead screw 67 and a guide bar 69, traverses imaging element 55 as it rotates. Axial movement of writing array 65 results from rotation of a stepper motor 72, which turns lead screw 67 and thereby shifts the axial position of writing array 65. Stepper motor 72 is activated during the time writing array 65 is positioned over void 60, after writing array 65 has passed over the entire surface of imaging element 55. The rotation of stepper motor 72 shifts writing array 65 to the appropriate axial location to begin the next imaging pass.

The axial index distance between successive imaging passes is determined by the number of imaging objects in writing array 65 and their configuration therein, as well as by the desired resolution. As shown in FIG. 2, a series of laser sources L1, L2, L3, . . . Ln, driven by suitable laser drivers collectively designated by reference numeral 75, each provide output to a fiber-optic cable. The lasers are preferably gallium-arsenide models, although any other lasers can be used.

The cables that carry laser output are collected into a bundle 77 and emerge separately into writing array 65. It may prove desirable, in order to conserve power, to maintain the bundle in a configuration that does not require bending above the fiber's critical angle of refraction (thereby maintaining total internal reflection).

Also as shown in FIG. 2, a controller 80 actuates laser drivers 75 when the associated lasers reach appropriate points opposite imaging element 55, and in addition operates stepper motor 72 and the cylinder drive motor 82.

Controller 80 receives data from two sources. The angular position of cylinder 50 with respect to writing array 65 is constantly monitored by a detector 85, which provides signals indicative of that position to controller 80. In addition, an image data source (e.g., a computer) also provides data signals to controller 80. The image data define points on imaging element 55 where image spots are to be written. Controller 80, therefore, correlates the instantaneous relative positions of writing array 65 and imaging element 55 (as reported by detector 85) with the image data to actuate the appropriate laser drivers at the appropriate times during scan of imaging element 55. The control circuitry required to implement this scheme is well-known in the scanner and plotter art.

Figure 3:
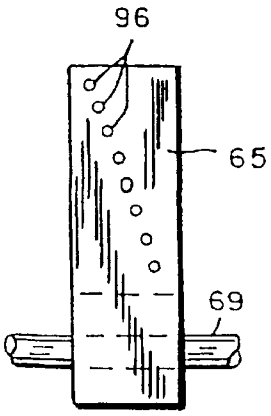
FIG. 3 is a front-end view of a writing array for imaging in accordance with the present invention, and in which imaging elements are arranged in a diagonal array.

The laser output cables terminate in lens assemblies 96, mounted within writing array 65, that preferably precisely focus the beams onto the surface of imaging element 55. A suitable lens-assembly design is described below, for purposes of the present discussion, these assemblies are generically indicated by reference numeral 96. A suitable configuration is illustrated in FIG. 3 in this arrangement, lens assemblies 96 are staggered across the face of body 65.

The staggered lens design facilitates use of a greater number of lens assemblies in a single head than would be possible with a linear arrangement. And since imaging time depends directly on the number of lens elements, a staggered design offers the possibility of faster overall imaging. Controller 80 either receives image data already arranged into vertical columns, each corresponding to a different lens assembly or can progressively sample, in columnar fashion, the contents of a memory buffer containing a complete bitmap representation of the image to be transferred. In either case, controller 80 recognizes the different relative positions of the lens assemblies with respect to imaging element 55 and actuates the appropriate laser only when its associated lens assembly is positioned over a point to be imaged.

Figure 4:
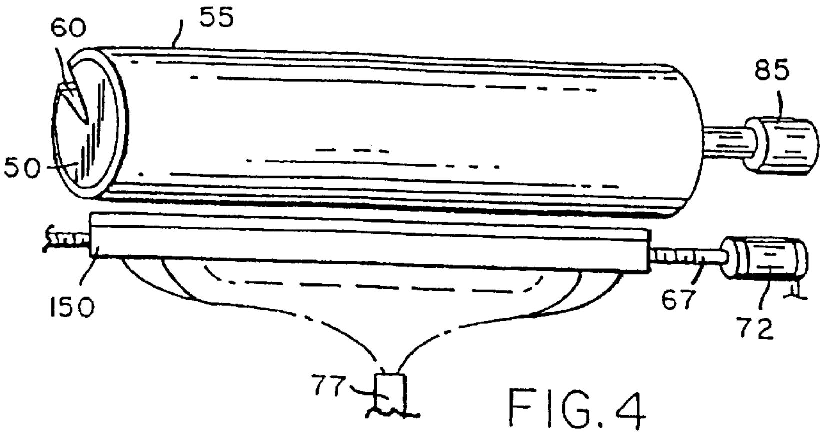
FIG. 4 is an isometric view of the cylindrical embodiment of an imaging apparatus suitable for use in accordance with the present invention, and which operates in conjunction with a linear-array writing array.

An alternative array design is illustrated in FIG. 4, which also shows the detector 85 mounted to the cylinder 50. In this case the writing array, designated by reference numeral 150, comprises a long linear body fed by fiber-optic cables drawn from bundle 77. The interior of writing array 150, or some portion thereof, contains threads that engage lead screw 67, rotation of which advances writing array 150 along imaging element 55 as discussed previously. Individual lens assemblies 96 are evenly spaced a distance B from one another. Distance B corresponds to the difference between the axial length of plate 55 and the distance between the first and last lens assembly; it represents the total axial distance traversed by writing array 150 during the course of a complete scan. Each time writing array 150 encounters void 60, stepper motor 72 rotates to advance writing array 150 an axial distance equal to the desired distance between imaging passes (i.e., the print density). This distance is smaller by a factor of n than the distance indexed by the previously described embodiment (writing array 65), where n is the number of lens assemblies included in writing array 65.

b. Output (guide and Lens Assembly)

Figure 5:
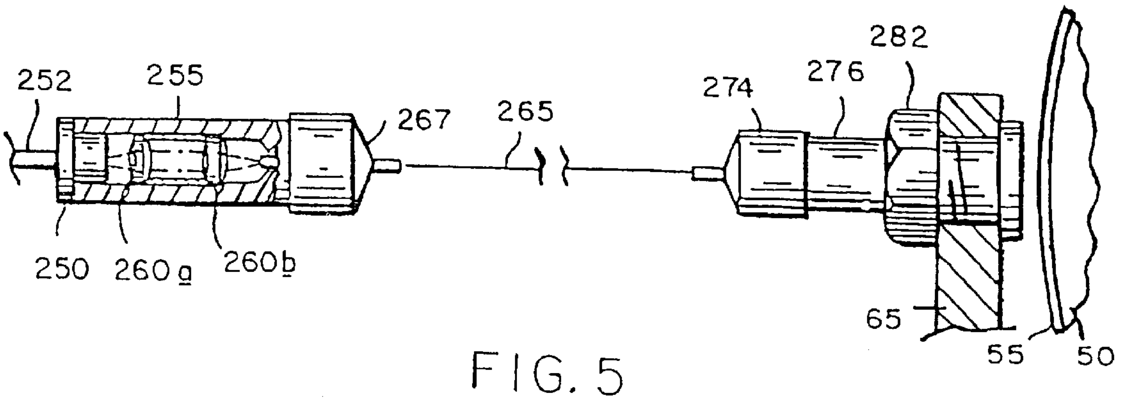
FIG. 5 is a cut-away view of a remote laser and beam-guiding system.
Figure 6:
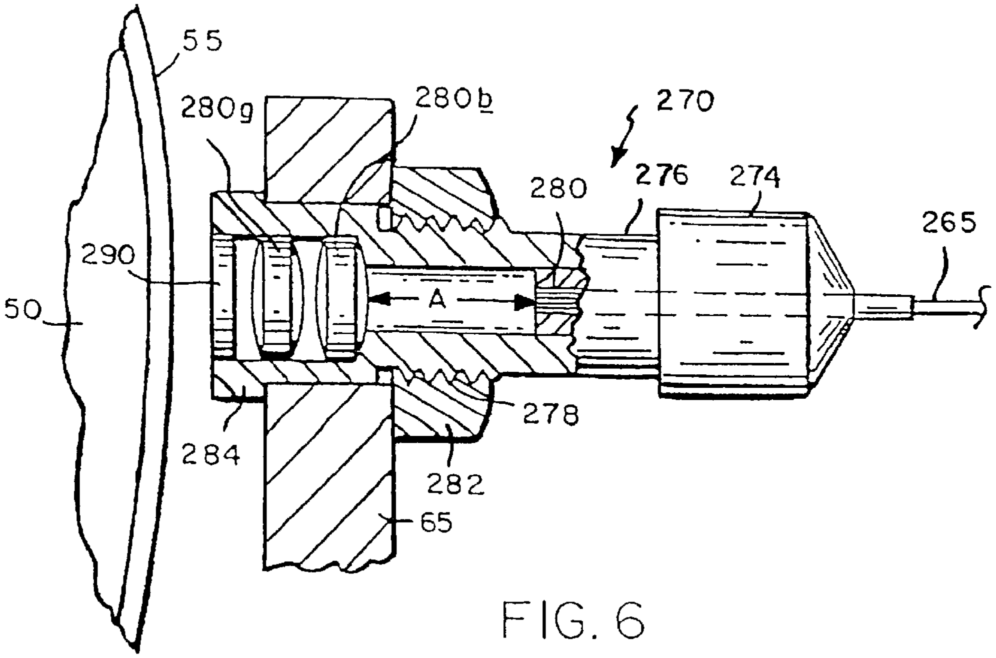
FIG. 6 is an enlarged, partial cut-away view of a lens element for focusing a laser beam from an optical fiber onto the surface of an imaging element.
Figure 7:
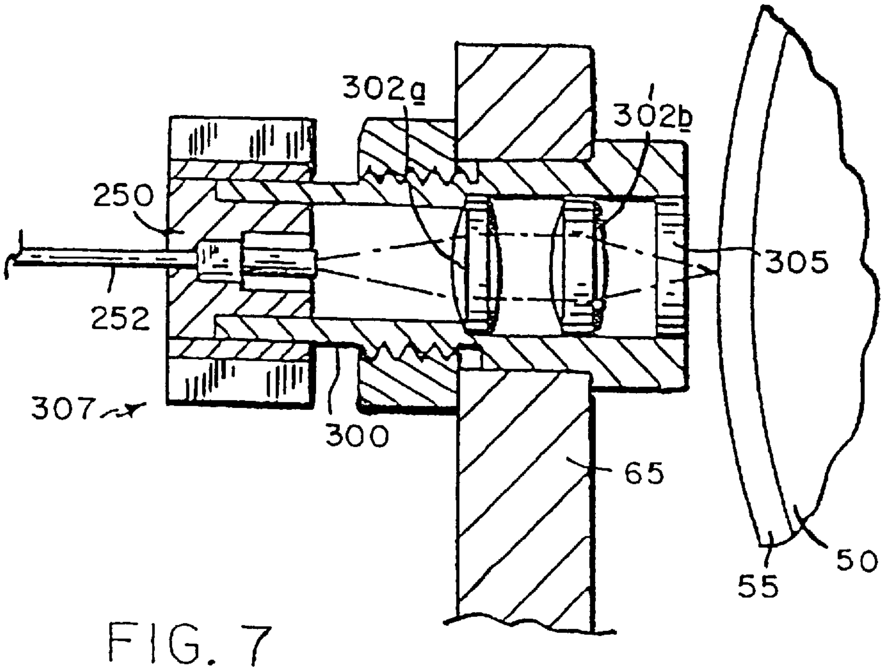
FIG. 7 is an enlarged, cut-away view of a lens element having an integral laser.

Suitable means for guiding laser output to the surface of a imaging element are illustrated in FIGS. 5–7. Refer first to FIG.5, which shows a remote laser assembly that utilizes a fiber-optic cable to transmit laser pulses to the imaging element. In this arrangement a laser source 250 receives power via an electrical cable 252. Laser 250 is seated within the rear segment of a housing 255. Mounted within the forepart of housing are two or more focusing lenses 260*a*. 260*b*, which focus radiation emanating from laser 250 onto the end face of a fiber-optic cable 265, which is preferably (although not necessarily) secured within housing 255 by a removable retaining cap 267. Cable 265 conducts the output of laser 250 to an output assembly 270, which is illustrated in greater detail in FIG. 6.

With reference to that figure, fiber-optic cable 265 enters the assembly 270 through a retaining cap 274 (which is preferably removable). Retaining cap 274 fits over a generally tubular body 276, which contains a series of threads 278. Mounted within the forepart of body 276 are two or more focusing lenses 280*a*, 280*b*, cable 265 is carried partway through body 276 by a sleeve 280. Body 276 defines a hollow channel between inner lens 280*b* and the terminus of sleeve 280, so the end face of cable 265 lies a selected distance A from inner lens 280*b*. The distance A and the focal lengths of lenses 280*a*, 280*b* are chosen so the at normal working distance from imaging element 55, the beam emanating from cable 265 will be precisely focused on the imaging elements surface. This distance can be altered-to vary the size of an image feature.

Body 276 can be secured to writing array 65 in any suitable manner. In the illustrated embodiments a nut 282 engages threads 278 and secures an outer flange 284 of body 276 against the outer face of writing array 65. The flange may, optionally, contain a transparent window 290 to protect the lenses from possible damage.

Alternatively, the lens assembly may be mounted within the writing array on a pivot that permits rotation in the axial direction (i.e., with reference to FIG. 6, through the plane of the paper) to facilitate fine axial positioning adjustment. If the angle of rotation is kept to 4° or less, the circumferential error produced by the rotation can be corrected electronically by shifting the image data before it is transmitted to controller 80.

Refer now to FIG. 7, which illustrates an alternative design in which the laser source irradiates the imaging elements surface directly, without transmission through fiber-optic cabling. As shown in the figure, laser source 250 is seated within the rear segment of an open housing 300. Mounted within the forepart of housing 300 are two or more focusing lenses 302*a*, 302*b*, which focus radiation emanating from laser 250 onto the surface of imaging element 55. The housing may, optionally, include a transparent window 305 mounted flush with the open end, and a heat sink 307.

It should be understood that while the preceding discussion of imaging configurations and the accompanying figures have assumed the use of optical fibers, in each case the fibers can be eliminated through use of the embodiment shown in FIG. 7.

c. Driver Circuitry

Figure 8:
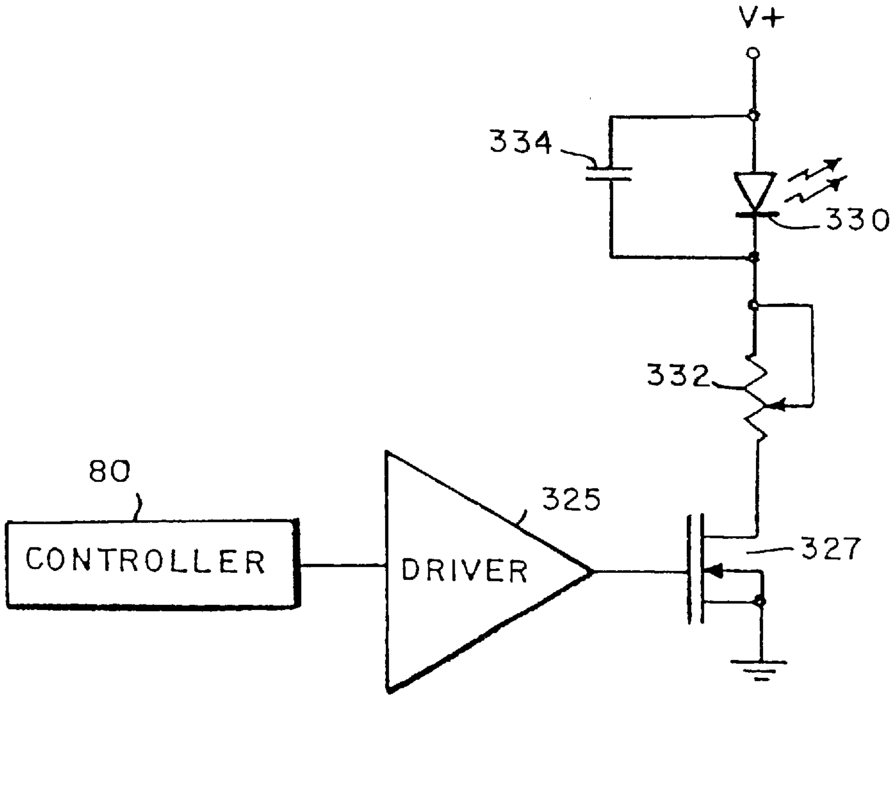
FIG. 8 is a schematic circuit diagram of a laser-driver circuit suitable for use with the present invention.

A suitable circuit for driving a diode-type (e.g., gallium arsenide) laser is illustrated schematically in FIG. 8. Operation of the circuit is governed by controller 80, which generates a fixed-pulse-width signal (preferably 5 to 20 μsec in duration) to a high-speed, high-current MOSFET driver 325. The output terminal of driver 325 is connected to the gate of a MOSFET 327. Because driver 325 is capable of supplying a high output current to quickly charge the MOSFET gate capacitance, the turn-on and turn-off times for MOSFET 327 are very short (preferably within 0.5 μsec) in spite of the capacitive load. The source terminal of MOSFET 327 is connected to ground potential.

When MOSFET 327 is placed in a conducting state, current flows through and thereby activates a laser diode 330. A variable current-limiting resistor 332 is interposed between MOSFET 327 and laser diode 330 to allow adjustment of diode output. Such adjustment is useful, for example, to correct for different diode efficiencies and produce identical outputs in all lasers in the system, or to vary laser output as a means of controlling image size.

A capacitor 334 is placed across the terminals of laser diode 330 to prevent damaging current overshoots,e.g., as a result of wire inductance combined with low laser-diode inter-electrode capacitance.

The present invention will be further illustrated by way of the following examples, without however the intention to limit the invention thereto. All parts are by weight unless otherwise specified.

EXAMPLE 1

Preparation of a Lithographic Base

A 0.2 mm thick aluminium foil was degreased by immersing the foil in an aqueous solution containing 5 g/l of sodium hydroxide at 50° C. and rinsed with demineralised water. The foil was then electrochemically grained using an alternating current in an aqueous solution containing 4 g/l of hydrochloric acid, 4 g/l of hydroboric acid and 0.5 g/l of aluminium ions at a temperature of 35° C. and a current density of 1200 A/m$^2$ to form a surface topography with an average center-line roughness $R_a$ of 0.5 μm.

After rinsing with demineralised water the aluminium foil was then etched with an aqueous solution containing 300 g/l of sulfuric acid ate 60° C. for 180 seconds and rinsed with demineralised water at 25° C. for 30 seconds.

The foil was subsequently subjected to anodic oxidation in an aqueous solution containing 200 g/l of sulfuric acid at at temperature of 45° C., a voltage of about 10 V and a current density of 150 A/m$^2$ for about 300 seconds to form an anodic oxidation film of 3 g/m$^2$ $Al_2O_3$, then washed with demineralised water, post treated with a solution containing 20 g/l of sodium bicarbonated at 40° C. for 30s, subsequently rinsed with demineralised water of 20° C. during 120s and dried.

The obtained lithographic base was submersed in an aqueous solution containing 5% by weight of citric acid for 60s, rinsed with demineralised water and dried at 40° C.

Preparation of the imaging element (material)

An imaging element according to the invention was produced by preparing the following coating composition and coating it to the above described lithographic base in an amount of 30 g/m$^2$ (wet coating amount) and drying it at 35° C.

Preparation of coating composition

To 6.75 g of a 20% dispersion of polymethylmethacrylate (average particle diameter of 90 nm) stabilised with Hostapal B (1% vs. polymer) in deionised water was subsequently added, 7 g of a 15% dispersion of carbon black and 1ml of a solution of a wetting agent in water, 73 g water and finally while stirring, 12 g of a 5% solution of a 98% hydrolysed polyvinylacetate having a weight average molecular weight of 200.000 g/mol in water is added.

Preparation of a printing plate and printing copies.

An imaging element as described above was subjected to a scanning Nd YLF infrared laser emitting at 1050 nm (scan speed 4 m/s, spot size 15 μm and 670 mW power on the surface of the imaging element).

The obtained image-wise exposed imaging element was mounted on an ABDIC 360™ offset printing press equipped with a VARN KOMPAC™ II dampening system. As ink, VanSon RB2329™ and as a dampening liquid G671c® (3% in water) commercially available from Agfa-Geveart NV were used.

Subsequent to mounting the imaging element, the press was started by allowing the print cylinder with the imaging element mounted thereon to rotate. The dampener rollers of the press were dropped on the imaging elements surface to as to supply dampening liquid to the imaging element and after 10 revolutions of the print cylinder, the ink rollers were dropped to supply ink. After a further 10 revolutions, clear prints were obtained with no ink uptake in the non-image parts.

EXAMPLE 2

An imaging element was prepared as described in example 1 with the exception that the submersion of the lithographic base in a citric acid solution was omitted and the lithographic base was directly coated with the coating composition.

A printing plate was prepared as in example 1 and after a total of 20 revolutions of the print cylinder, clear prints were obtained without ink uptake in the non-image areas.

EXAMPLE 3

Preparation of a Lithographic Base

To 398 g of a dispersion contg. 21.5% $TiO_2$ (average particle size 0.3 to 0.5 $\mu$m) and 2.5% polyvinyl alcohol in deionized water were subsequently added, while stirring, 195 g of a hydrolyzed 22% tetramethylorthosilicate emulsion in water and 12 g of a 10% solution of a wetting agent.

To this mixture was added 395 g of deionized water and the pH was adjusted to pH=4.

The obtained dispersion was coated on a polyethylene-terephthalate film support (coated with a hydrophilic adhesion layer) to a wet coating thickness of 50 g/$m^2$, dried at 30° C. and subsequently hardened by subjecting it to a temperature of 57° C. for 1 week.

An imaging element using the above described lithographic base and printing plate therefrom were then prepared as described in example 1. After 20 revolutions, clear prints without ink uptake in the non-image areas were obtained.

We claim:

1. A method for making a lithographic printing plate comprising the steps of:

(1) image-wise exposing to light an imaging element comprising (i) an image forming layer comprising hydrophobic thermoplastic polymer particles capable of coalescing under the influence of heat and dispersed in a hydrophilic binder wherein the image forming layer is on a hydrophilic surface of a lithographic base and (ii) a compound capable of converting light to heat, said compound being included in said image forming layer or a layer adjacent thereto;

(2) and developing a thus obtained image-wise exposed imaging element by mounting it on a print cylinder of a printing press and supplying an aqueous dampening liquid and subsequently ink to said image forming layer while rotating said print cylinder, wherein said image-wise exposure is carried out by a laser, a LED or a plurality of lasers.

2. A method according to claim 1 wherein said compound capable of converting light to heat is selected from the group consisting of an infrared absorbing dye, carbon black, a metal boride, a metal carbide, a metal nitride, a metal carbonitride and a conductive polymer particle.

3. A method according to claim 1 wherein said compound capable of converting light to heat is included in said image forming layer.

4. A method according to claim 1 wherein said lithographic base is an anodized aluminium or comprises a flexible support having thereon a cross-linked hydrophilic layer.

5. A method according to claim 1 wherein said thermoplastic polymer particles have a coagulation temperature of at least 35° C.

6. A method according to claim 1 wherein said hydrophilic binder in said image forming layer is selected from the group consisting of a polyvinylalcohol, a poly(meth)acrylic acid, a poly(meth)acrylamide, a polyhydroxyethyl(meth) acrylate, a polyvinylmethylether, and a polysacharide.

7. A method according to claim 1 wherein said hydrophobic thermoplastic polymer particles are selected from the group consisting of polyethylene, polystyrene, polymethyl (meth)acrylate, polyvinylchloride, polyethyl(meth)acrylate, polyvinylidenechloride, polyacrylonitrile and polyvinylcarbazole.

8. A method according to claim 1 wherein said lithographic printing plate formed is a seamless sleeve printing plate.

* * * * *